United States Patent
Goller et al.

(10) Patent No.: US 8,466,009 B2
(45) Date of Patent: Jun. 18, 2013

(54) METHOD OF FABRICATING A SEMICONDUCTOR PACKAGE WITH MOLD LOCK OPENING

(75) Inventors: Bernd Goller, Otterfing (DE); Markus Dinkel, Taufkirchen (DE); Wae Chet Yong, Malacca (MY); Teck Sim Lee, Malacca (MY); Boon Kian Lim, Melacca (MY)

(73) Assignee: Infineon Technologies AG, Neubiberg (DE)

( * ) Notice: Subject to any disclaimer, the term of this patent is extended or adjusted under 35 U.S.C. 154(b) by 198 days.

(21) Appl. No.: 12/779,367

(22) Filed: May 13, 2010

(65) Prior Publication Data

US 2010/0227436 A1    Sep. 9, 2010

Related U.S. Application Data

(62) Division of application No. 12/041,757, filed on Mar. 4, 2008, now Pat. No. 7,732,937.

(51) Int. Cl.
*H01L 23/28* (2006.01)
*H01L 23/495* (2006.01)

(52) U.S. Cl.
USPC .......... 438/112; 438/124; 438/126; 438/127; 257/667; 257/E23.043; 257/E21.502

(58) Field of Classification Search
None
See application file for complete search history.

(56) References Cited

U.S. PATENT DOCUMENTS

| | | | |
|---|---|---|---|
| 4,143,456 A | 3/1979 | Inoue | |
| 5,203,076 A | 4/1993 | Banerji et al. | |
| 5,218,234 A | 6/1993 | Thompson et al. | |
| 5,612,576 A | 3/1997 | Wilson et al. | |
| 5,998,243 A | 12/1999 | Odashima et al. | |
| 6,038,136 A | 3/2000 | Weber | |
| 6,081,997 A | 7/2000 | Chia et al. | |
| 6,250,606 B1 | 6/2001 | Juso et al. | |
| 6,627,976 B1 * | 9/2003 | Chung et al. | 257/666 |
| 7,078,271 B2 * | 7/2006 | Mahle | 438/123 |
| 7,288,843 B2 | 10/2007 | Prior et al. | |
| 7,781,899 B2 * | 8/2010 | Sim et al. | 257/787 |
| 2008/0157330 A1 | 7/2008 | Kroehnert et al. | |

FOREIGN PATENT DOCUMENTS

WO            0143518            6/2001

* cited by examiner

*Primary Examiner* — Zandra Smith
*Assistant Examiner* — Pamela E Perkins
(74) *Attorney, Agent, or Firm* — Dicke, Billig & Czaja, PLLC

(57) ABSTRACT

A method of fabricating a semiconductor package. In one embodiment the method includes forming a mold cavity about a portion of a first major surface of a leadframe, including about a mold lock opening extending through the leadframe between the first major surface and a second major surface. A spacer is inserted to fill at least a portion of the mold lock opening. The mold cavity is filled with an encapsulating material including filling a portion of the mold lock opening not occupied by the spacer.

14 Claims, 9 Drawing Sheets

METHOD OF FABRICATING A SEMICONDUCTOR PACKAGE WITH MOLD LOCK OPENING

CROSS-REFERENCE TO RELATED APPLICATIONS

This Divisional Patent Application claims priority to U.S. patent application Ser. No. 12/041,757, filed Mar. 4, 2008, which is incorporated herein by reference.

BACKGROUND

Various semiconductor chip packages are known which provide support for an integrated circuit chip or die and associated bond wires, provide protection from hostile environments, and enable surface mounting of the die to and interconnection with a printed circuit board. One package configuration includes a leadframe having a die pad and wire bond pads, with the die being bonded to the die pad and being electrically coupled to the wire bond pads via bonding leads or wires. An encapsulating material, such as plastic, epoxy, or resin, for example, is formed over the die and bonding wires and a portion of the die pad and wire bond pads and fills a space between the die and wire bond pads.

To better ensure that the encapsulating material does not pull away or separate from the die pad, one package configuration includes a mold lock opening which extends through the die pad and is wider on a surface of the die pad opposite the die. During the packaging process, the liquid encapsulating material fills the mold lock opening so that after curing or hardening, the encapsulating material is mechanically coupled to the die pad. However, during subsequent attachment of the chip package to a printed circuit board (PCB), which is typically achieved using reflow soldering techniques, solder does not adhere to the encapsulating material filling the mold lock opening. As a result, air pockets may form and be trapped in solder in the region below the mold lock opening which can lead to cracking of the solder and separation of the chip package from the PCB.

SUMMARY

One embodiment provides a semiconductor package including a leadframe having first and second major surfaces and a mold lock opening extending between the first and second major surfaces. The semiconductor package includes a semiconductor die coupled to the first major surface, and an encapsulating material formed about the semiconductor chip and a portion of the first major surface of the leadframe and filling all but a portion of the mold lock opening, the unfilled portion of the mold lock opening forming a vent extending from the second major surface to the first major surface, the vent providing a pathway for air to escape from between the second major surface and a surface to which the second major surface is to be attached.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
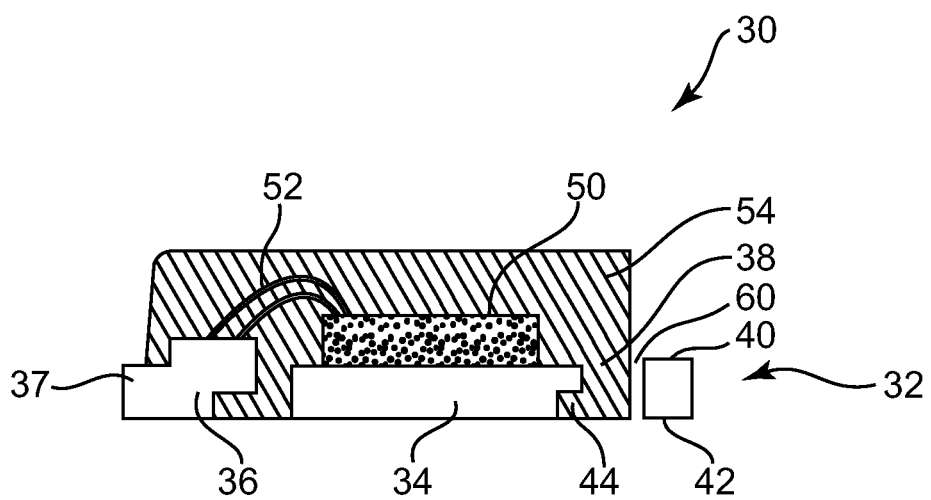
FIG. 1 is a cross-sectional view illustrating a semiconductor package according to one embodiment.

FIG. 1 is a cross-sectional view generally illustrating a semiconductor package 30 employing a mold lock opening and air-relief vent according to one embodiment. Semiconductor package 30 includes a leadframe assembly 32 having a die pad 34 and a plurality of wire bond pads 36 extending to a plurality of leads 37. Die pad 34 includes a mold lock opening 38 which extends through die pad 34 from a front or top surface 40 to a rear or bottom surface 42. In one embodiment, mold lock opening 38 includes a mold lock notch 44 so that mold lock opening 38 is larger or has a greater area proximate to bottom surface 42 than to top surface 40.

Figure 2:
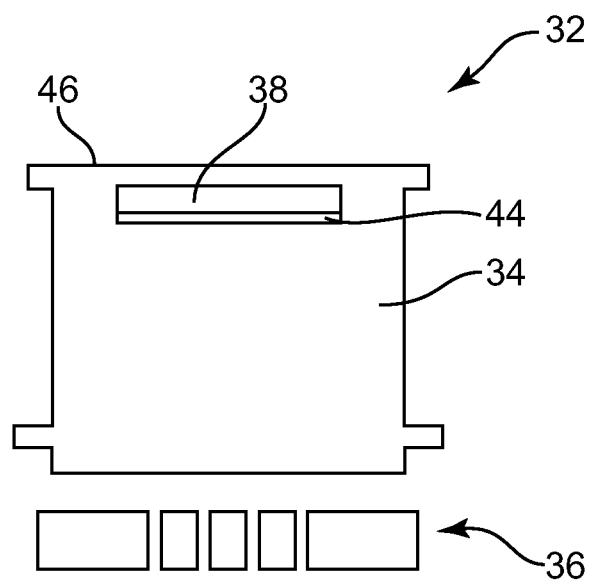
FIG. 2 is a cross-sectional view of a leadframe assembly according to one embodiment.

FIG. 2 is a bottom view illustrating one embodiment of leadframe assembly 32. As illustrated, mold lock opening 38 is spaced from and extends along a portion of a perimeter edge 46 of die pad 36 opposite to wire bond pads 36. Although illustrated as being rectangular in shape, mold lock opening 38 may be of other shapes as well.

With reference to FIG. 1, semiconductor package 30 further includes a semiconductor chip or die 50 which is bonded to die pad 34, such as with an epoxy, for example. A plurality of bonding wires 52 electrically couple die 50 to the plurality of wire bond pads 50. An encapsulating material 54, such as plastic, epoxy, or resin, for example, is formed over die 50 and bonding wires 52, and over a portion of die pad 34 and wire bond pads 36, with at least a portion of leads 37 remaining exposed. Encapsulating material 54 fills spaces between die 50 and wire bond pads 36, and about bonding wires 52 and wire bond pads 36.

Encapsulating material 54 also fills all but a portion of mold lock opening 38, with an unfilled portion of mold lock opening 38 forming a pathway or vent 60 free of encapsulating material 54 which extends through die pad 34 from bottom surface 42 to top surface 40. As described below, vent 60 provides an escape for air which might otherwise be trapped below mold lock opening 50 when attaching semiconductor package 30 to an electronic device, such as a PCB, for example. By being wider at bottom surface 42 than at top surface 40 (i.e. the side to which die 50 is bonded), mold lock opening 38 forms a mechanical key or interlock which holds encapsulating material 50 in place and prevents it from separating or pulling away from die and wire bond pads 34 and 36 and from die 50.

Figure 3:
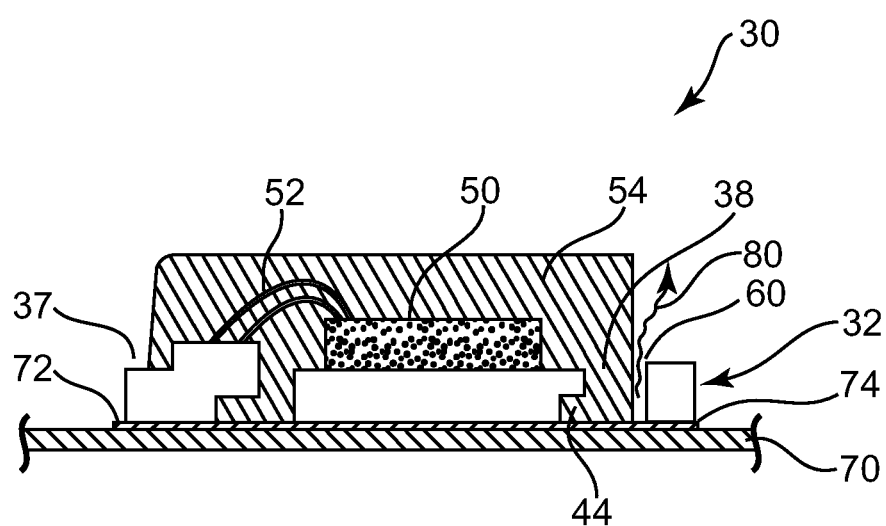
FIG. 3 is a cross-sectional view of the semiconductor package of FIG. 1 attached to a surface.

FIG. 3 illustrates semiconductor package 30 of FIG. 1 after being attached to a surface of a PCB 70. One conventional method for attaching semiconductor packages to PCBs, such as semiconductor package 30 to PCB 70, is to separately solder die pad 34 and each of the plurality of wire bond pads 36 to a corresponding terminal or attachment pad (e.g. a copper pad) on PCB 70 using a reflow soldering process. During a typical reflow soldering process, solder paste is applied to the various attachment pads and the semiconductor package is positioned and aligned accordingly. The PCB and semiconductor package are then heated in an oven to melt solder particles in the paste and form solder bonds (i.e. metallurgical bonds) between the semiconductor package and PCB, such as illustrated by solder bonds 72 and 74 between semiconductor package 30 and PCB 70.

PCBs, such as PCB 70, are typically configured to accept a variety of semiconductor packages so that the attachment pads on PCB 70 are not individually tailored to a particular semiconductor package, such as semiconductor package 30. For example, PCBs, such as PCB 70, typically employ a single die attachment pad for boding to the die pad which has dimensions to at least encompass the entire die pad, such as die pad 34. As such, during the reflow soldering process, solder paste is applied across the entire die attachment pad such that the solder bond covers at least the entire bottom surface of the die pad, such as illustrated by solder bond 74 covering the entire bottom surface 42 of die pad 34, including the area beneath mold lock opening 38.

However, it is noted that solder bond 74 does not adhere to encapsulating material 54. As a result, the area between the encapsulating material within mold lock opening 34 and solder bond 54 may potentially lead to the formation and trapping of air pockets within solder bond 74 during the solder reflow process. Thermal expansion of such trapped air pockets during subsequent operation of semiconductor package 30 could lead to cracking of solder bond 74, thereby potentially weakening or compromising both the mechanical and electrical connection between semiconductor package 30 and PCB 70.

By forming a pathway free of encapsulating material 54 from bottom surface 42 to top surface 40, vent 60 provides a way of escape for any air, as illustrated at 80, which may otherwise form and be trapped below mold lock opening 38 during the reflow soldering process. As such, vent 60 reduces the potential for cracking of solder bond 74 between die pad 34 and PCB 70 and increases the reliability of the connection of semiconductor package 30 to PCB 70 and, thus, the reliability of a device of which PCB 70 is a part.

Figure 4A:
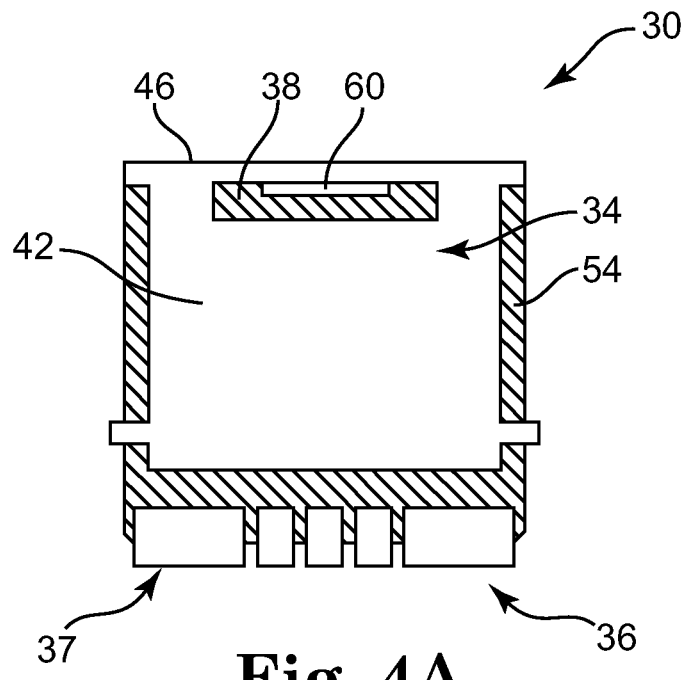
FIG. 4A is a bottom view of the semiconductor package of FIG. 1.
Figure 4B:
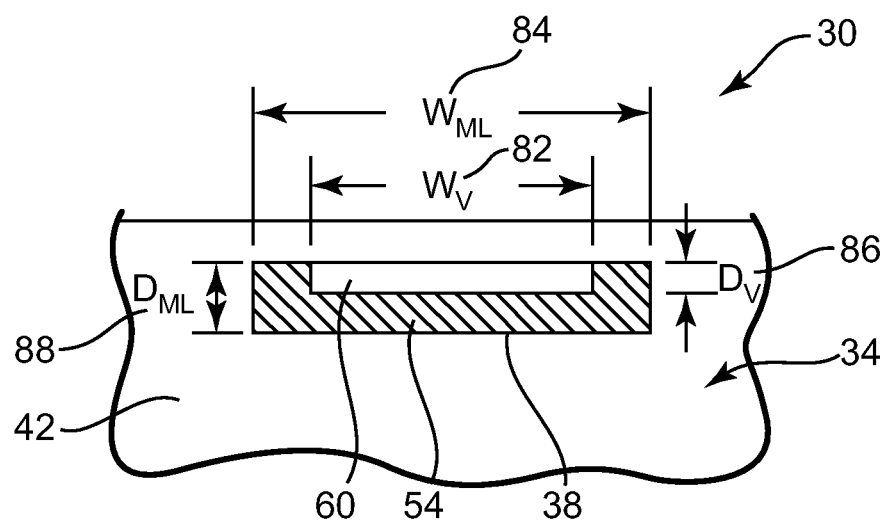
FIG. 4B is an enlarged view of a portion of the semiconductor package of FIG. 4A.

FIG. 4A is a bottom view of semiconductor package 30 of FIG. 1. FIG. 4B is an enlarged view of a portion of FIG. 4A illustrating mold lock opening 38 and vent 60 in greater detail. In one embodiment, vent 60 has a width $W_V$, as indicated at 82, which is less than a width $W_{ML}$, as indicated at 84, of mold lock opening 38. In one embodiment (not illustrated), width $W_V$ 82 of vent 60 extends the full width $W_{ML}$ 84 of mold lock opening 38. Additionally, vent 60 has a depth $D_V$, as indicated at 86, which is less than a depth $D_{ML}$ of mold lock opening 38 on bottom surface 42 of die pad 34, as indicated at 88. In one embodiment, depth $D_V$ 86 of vent 60 is less than a depth of mold lock opening 38 proximate to top surface 40 (see FIGS. 1 and 3). In one example embodiment, vent 60 has a width $W_V$ 82 ranging from 2 to 10 mm, depending on a size semiconductor package 30, and a minimum depth $D_V$ 86 of 0.5 mm.

Figure 5:
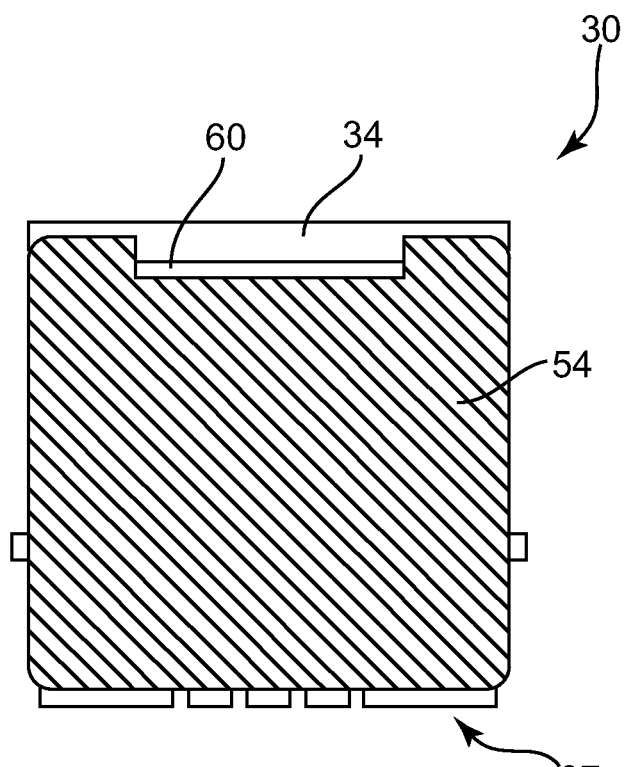
FIG. 5 is a top view of the semiconductor package of FIG. 1.
Figure 6:
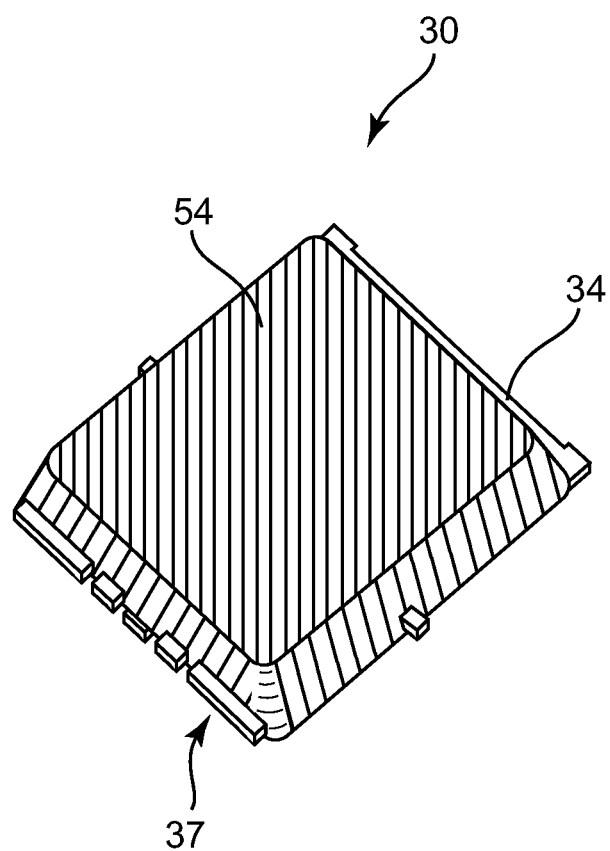
FIG. 6 is a perspective view of the semiconductor package of FIG. 1.

FIGS. 5 and 6 respectively illustrate top and perspective views of semiconductor package 30 of FIG. 1, with the top view of FIG. 5 illustrating vent 60 extending through die pad 34.

Figure 7:
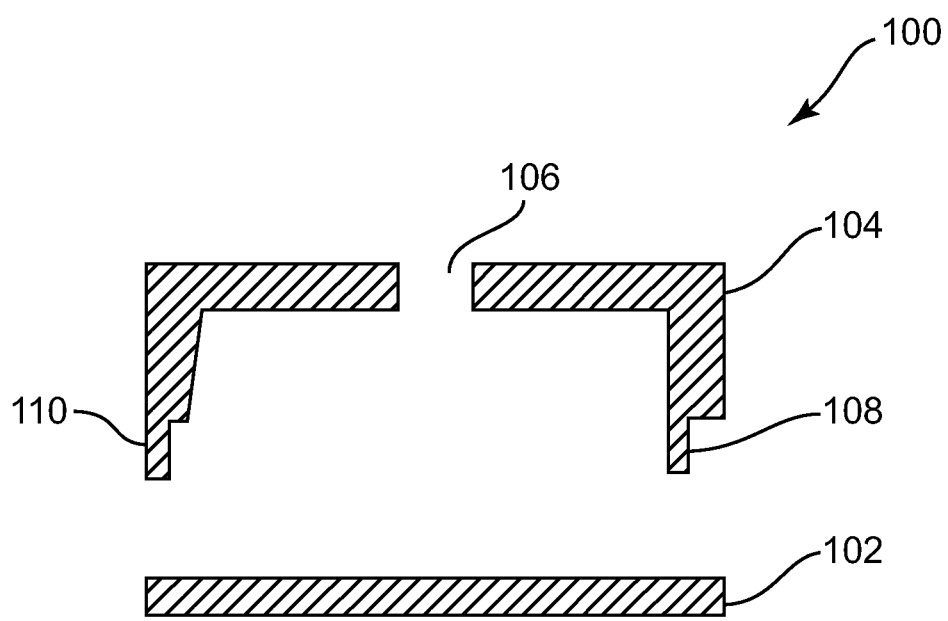
FIG. 7 is a cross-sectional view illustrating a mold tool according to one embodiment.

FIG. 7 is a cross-sectional view generally illustrating one embodiment of a mold tool 100 for encapsulating a semiconductor chip and associated bonding wires bonded to a leadframe assembly, such as semiconductor package 30 and vent 60 described above. Mold tool 100 includes a base 102 and a cover respectively configured to engage a bottom surface and a top surface of a leadframe, such as bottom surface 42 and top surface 40 of leadframe 32. Cover 104 further includes a port 106 and a spacer 108 configured to extend into and engage at least a portion of a mold lock opening, such as mold lock opening 38. In one embodiment, spacer 108 has a so-called "anti-flash" profile which, as will be described later, is configured to prevent penetration of encapsulating material 54 below spacer 108 during a molding process. An opposing edge 110 of cover 104 is configured to engage wire bond pads, such as the plurality of wire bond pads 36.

Figure 8:
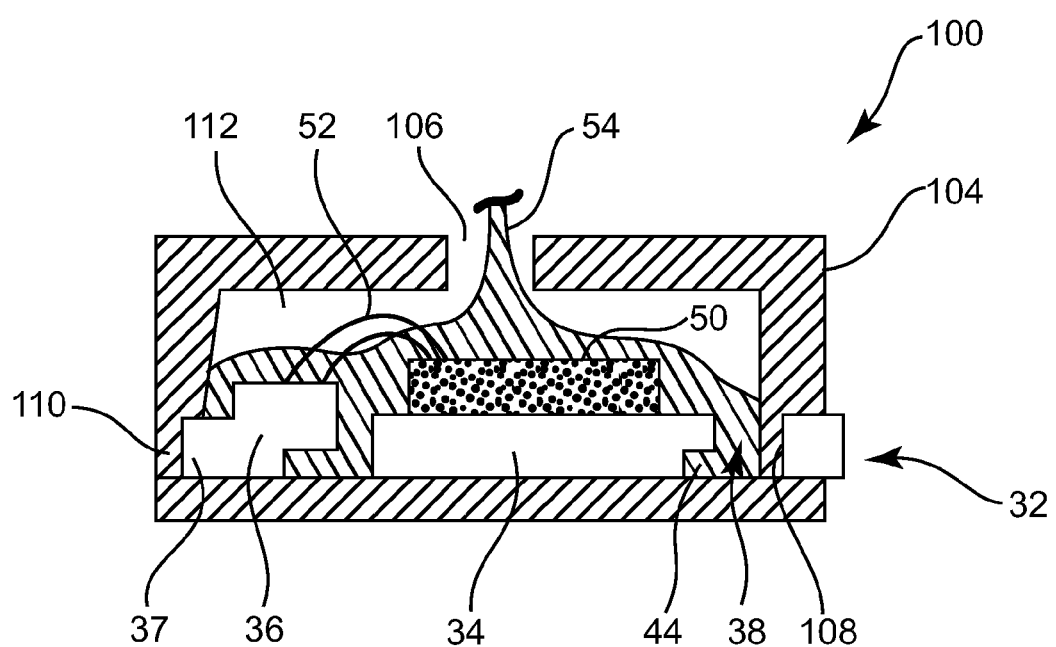
FIG. 8 is a cross-sectional view illustrating the mold tool of FIG. 7.

FIG. 8 is a cross-sectional view illustrating mold tool 100 engaging semiconductor package 30 during an example molding or encapsulating process. As illustrated, base 102 engages bottom surface 42 of leadframe assembly 32 and cover 104 engages top surface 40 of leadframe assembly 32, with edge 110 engaging wire bond pads 36 and leads 37 and spacer 108 engaging and extending through a portion of mold lock opening 38 and contacting base 102. Together, base 102 and cover 104 form a cavity 112 about die 50 and an upper portion of leadframe assembly 32.

Encapsulating material 54, in a liquid state, is injected into mold cavity 112 through cover 104 via port 106. Encapsulating material 54 fills mold cavity 112, covering die 50, upper surface 40 of leadframe assembly 32, bonding wires 52, filling spaces and voids between die pad 34 wire bonding pads 36, and filling mold lock opening 38, including mold lock notch 44. Upon curing or hardening of encapsulating material 54, base 102 and cover 104 are disengaged from leadframe assembly 32 to provide semiconductor package 30 as illustrated by FIG. 1, the removal of spacer 108 from mold lock opening 38 forming vent 60.

Figure 9:
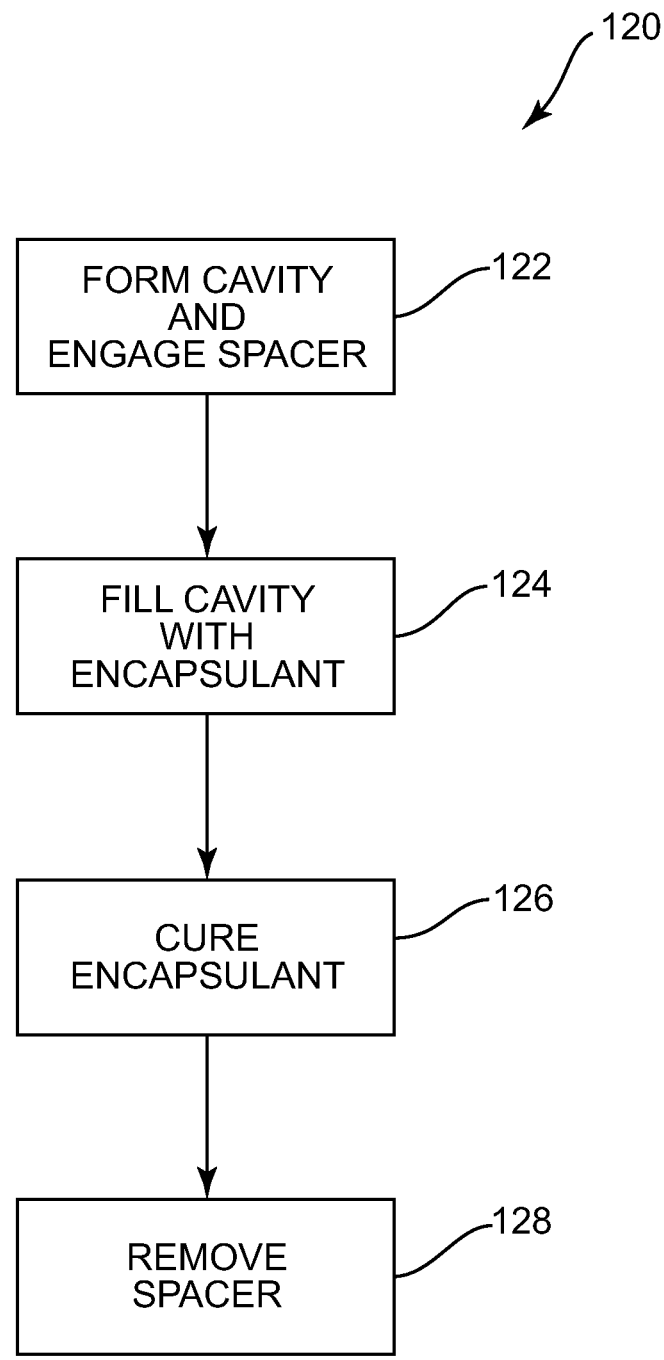
FIG. 9 is a flow diagram generally describing a molding process according to one embodiment.

FIG. 9 is a flow diagram generally illustrating a process 120 for forming a semiconductor package employing a mold lock opening and vent, such as semiconductor package 30. Process 120 begins at 122, where a cavity is formed about top surface 40 of leadframe assembly 32, including about die 50, a portion of die pad 34, including mold lock opening 38, and about bonding wire 52 and a portion of wire bond pads 36. Formation of the cavity includes positioning of a spacer, such as spacer 108, within a portion of mold lock opening 38. One example of the formation of a cavity and spacer placement is the formation of cavity 112 and positioning of spacer 108 by mold tool 100, as described above by FIGS. 7 and 8.

At 124, the cavity is filled with a liquid encapsulating material to cover die 50, upper surface 40 of leadframe assembly 32, bonding wires 52, fill spaces and voids between die pad 34 wire bonding pads 36, and fill mold lock opening 38, including mold lock notch 44. At 126, the liquid encapsulating material is cured or hardened. Process 120 concludes at 128 with removal of the spacer element from mold lock opening and of the semiconductor package from the cavity.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor package, the method comprising:
    forming a mold cavity about a portion of a first major surface of a leadframe, including about a mold lock opening extending through the leadframe between the first major surface and a second major surface;
    inserting a spacer to fill at least a portion of the mold lock opening such that the spacer extends to the second major surface of the leadframe; and
    filling the mold cavity with an encapsulating material including filling a portion of the mold lock opening not occupied by the spacer.

2. The method of claim 1, including:
    curing the encapsulating material;
    removing the spacer so as to form a vent within the mold lock opening, the vent being free of encapsulating material and extending between the first and second major surfaces of the leadframe.

3. The method of claim 1, wherein inserting the spacer includes inserting a spacer having a cross-sectional area less than a cross sectional area of the mold lock opening at the first major surface of the leadframe.

4. The method of claim 1, wherein the mold lock opening is rectangular, and wherein inserting the spacer includes inserting a spacer having a width up to a width of the mold lock opening and having a depth less than a depth of the mold lock opening at the first major surface of the leadframe.

5. The method of claim 1, wherein forming the mold cavity includes forming a mold cavity about a semiconductor die attached to the first major surface of the leadframe.

6. The method of claim 1, wherein inserting the spacer comprises inserting a spacer having an anti-flash profile.

7. The method of claim 1, wherein the mold lock opening is wider at the second major surface of the leadframe than at the first major surface of the leadframe.

8. A method of fabricating a semiconductor package, the method comprising:
    providing a mold tool comprising a base and a cover, the cover comprising a spacer;
    engaging the cover to a first major surface of a leadframe;
    engaging the base to a second major surface of the leadframe such that the spacer directly contacts the base to fill at least a portion of a mold lock opening extending through the leadframe between the first major surface and the second major surface and to form a mold cavity about a portion of the first major surface of the leadframe, including about the mold lock opening; and
    filling the mold cavity with an encapsulating material including filling a portion of the mold lock opening not occupied by the spacer.

9. The method of claim 8, including:
    curing the encapsulating material;
    removing the spacer so as to form a vent within the mold lock opening, the vent being free of encapsulating material and extending between the first and second major surfaces of the leadframe.

10. The method of claim 8, wherein the spacer has a cross-sectional area less than a cross sectional area of the mold lock opening at the first major surface of the leadframe.

11. The method of claim 8, wherein the mold lock opening is rectangular, and wherein the spacer has a width up to a width of the mold lock opening and a depth less than a depth of the mold lock opening at the first major surface of the leadframe.

12. The method of claim 8, wherein the mold cavity is formed about a semiconductor die attached to the first major surface of the leadframe.

13. The method of claim 8, wherein the spacer has an anti-flash profile.

14. The method of claim 8, wherein the mold lock opening is wider at the second major surface of the leadframe than at the first major surface of the leadframe.

* * * * *